United States Patent
Hayashi

(10) Patent No.: US 12,431,342 B2
(45) Date of Patent: Sep. 30, 2025

(54) CHARGED PARTICLE DETECTOR

(71) Applicant: HAMAMATSU PHOTONICS K.K., Hamamatsu (JP)

(72) Inventor: Masahiro Hayashi, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 439 days.

(21) Appl. No.: 18/076,500

(22) Filed: Dec. 7, 2022

(65) Prior Publication Data

US 2023/0238227 A1    Jul. 27, 2023

(30) Foreign Application Priority Data

Jan. 25, 2022    (JP) ................. 2022-009278

(51) Int. Cl.
*H01J 43/12*    (2006.01)
(52) U.S. Cl.
CPC .......... *H01J 43/12* (2013.01); *G01N 2223/07* (2013.01); *G01N 2223/507* (2013.01)
(58) Field of Classification Search
USPC ....................................................... 250/397
See application file for complete search history.

(56) References Cited

U.S. PATENT DOCUMENTS

| 4,568,853 A | 2/1986 | Boutot | |
| 5,594,301 A | 1/1997 | Sawai et al. | |
| 6,617,768 B1 * | 9/2003 | Hansen | H01J 49/025 |
| | | | 313/105 CM |
| 2016/0217972 A1 | 7/2016 | Hayashi | |
| 2016/0217995 A1 | 7/2016 | Hayashi | |

FOREIGN PATENT DOCUMENTS

| JP | S57-196466 A | 12/1982 |
| JP | H04-98752 A | 3/1992 |
| JP | H05-114385 A | 5/1993 |
| JP | H10-106481 A | 4/1998 |

* cited by examiner

*Primary Examiner* — Kiet T Nguyen
(74) *Attorney, Agent, or Firm* — Faegre Drinker Biddle & Reath LLP

(57) ABSTRACT

A charged particle detector includes a microchannel plate having an input surface having electrons (charged particles) input thereon, a multiplication portion performing multiplication of electrons while maintaining positional information of the electrons, and an output surface outputting electrons multiplied by the multiplication portion; a multi-dynode having a plurality of dynodes multiplying the electrons output from the output surface, and insulation regions positioned between the dynodes; and an anode disposed in a spatial region between the output surface and the multi-dynode, and having collection portions for collecting electrons multiplied by the dynodes and aperture portions for allowing electrons output from the output surface to pass therethrough to the dynodes side. All of the insulation regions overlap the collection portions when viewed in an output direction of the electrons from the output surface.

7 Claims, 10 Drawing Sheets

CHARGED PARTICLE DETECTOR

TECHNICAL FIELD

The present disclosure relates to a charged particle detector.

BACKGROUND

In charged particle detectors including a microchannel plate, improvement in output linearity of the microchannel plate is required. The output linearity of a microchannel plate is inversely proportional to a resistance value of the microchannel plate. For this reason, it is essential to reduce the resistance in microchannel plates, but improvement in output linearity by means of reduction in resistance is already approaching its limit.

In order to achieve improvement in output linearity from another viewpoint, a triode structure in which a mesh anode and a multi-dynode are combined with a microchannel plate has been studied. Regarding charged particle detectors in the related art having a triode structure, for example, Japanese Unexamined Patent Publication No. S57-196466 discloses an electron multiplication device. This electron multiplication device in the related art includes at least one microchannel plate performing radiation of secondary electrons. The microchannel plate has an input surface and an output surface, and dynodes and a latticed anode are disposed parallel to the output surface.

SUMMARY

In FIG. 4 of Japanese Unexamined Patent Publication No. S57-196466 described above, a multi-dynode in which a plurality of independent elements are disposed on an insulating substrate is disposed parallel to an output surface of a microchannel plate together with a latticed anode. However, in such a constitution, electrification in regions between the elements (insulation regions) on the insulating substrate constituting the multi-dynode becomes a problem. It is conceivable that acquisition of a detection signal from the multi-dynode become unstable when electrification occurs in the insulation regions.

The present disclosure has been made in order to resolve the foregoing problems, and an object thereof is to provide a charged particle detector capable of stably acquiring a detection signal from a multi-dynode.

A charged particle detector according to an aspect of the present disclosure includes a microchannel plate having an input surface having charged particles input thereon, a multiplication portion performing multiplication of electrons based on an input of the charged particles while maintaining positional information of the charged particles with respect to the input surface, and an output surface outputting electrons multiplied by the multiplication portion; a multi-dynode having a plurality of dynodes multiplying the electrons output from the output surface, and insulation regions positioned between the dynodes; and an anode disposed in a spatial region between the output surface and the multi-dynode, and having collection portions for collecting electrons multiplied by the dynodes and aperture portions for allowing electrons output from the output surface to pass therethrough to the multi-dynode side. All of the insulation regions overlap the collection portions when viewed in an output direction of the electrons from the output surface.

In this charged particle detector, when viewed in the output direction of electrons output from the output surface of the microchannel plate, all of the insulation regions in the multi-dynode overlap the collection portions in the anode. For this reason, incidence of electrons from the output surface on the insulation regions can be curbed, and electrification can be prevented from occurring in the insulation regions. Accordingly, occurrence of crosstalk between the dynodes due to capacitive coupling can be curbed. Therefore, in this charged particle detector, it is possible to stably acquire a detection signal from the multi-dynode.

The anode may be disposed on the multi-dynode side of an intermediate position between the output surface and the multi-dynode. In this case, electrons multiplied by each dynode of the multi-dynode can be efficiently collected by the anode. Therefore, a practical electron multiplication factor can be increased, and a dynamic range of the charged particle detector can be improved.

The anode may further have auxiliary collection portions laid across the aperture portions. In this case, electrons multiplied by each dynode of the multi-dynode can be more efficiently collected by the anode.

Widths of the auxiliary collection portions may be smaller than widths of the collection portions. In this case, while permeability of electrons from the anode to the multi-dynode is maintained, electrons multiplied by each dynode of the multi-dynode can be efficiently collected by the anode.

The dynodes may be constituted of an insulating substrate, and an electrode layer and a multiplication layer provided on the insulating substrate. A width of the multiplication layer may be smaller than a width of the electrode layer. In this case, since the multiplication layer is distant from the insulating substrate, capacitive coupling between the dynodes can be prevented. Therefore, occurrence of crosstalk between the dynodes can be more reliably curbed.

When a spread angle of electrons output from the output surface is $\theta$, heights of the dynodes are h, widths of the insulation regions are D, and a distance from the anode to bottom surfaces of the dynodes is Y, widths W of the collection portions may satisfy $W=2(Y-h)\tan\theta+D$. It is possible to more reliably curb incidence of electrons output from the output surface on the insulation regions at the spread angle $\theta$ by satisfying such conditions.

The charged particle detector may further include a positioning mechanism performing positioning of the anode and the multi-dynode. The positioning mechanism may include a first end portion electrode on the microchannel plate side and a second end portion electrode on the multi-dynode side. The anode and the multi-dynode may be screw-fixed in a state of being sandwiched between the first end portion electrode and the second end portion electrode. Due to such a positioning mechanism, positioning of the anode and the multi-dynode can be simply performed. As a result, the insulation regions in the multi-dynode and the collection portions in the anode can have an accurately coincident disposition relationship therebetween as designed.

DETAILED DESCRIPTION

Hereinafter, with reference to the drawings, a preferred embodiment of a charged particle detector according to an aspect of the present disclosure will be described in detail.

Figure 1:
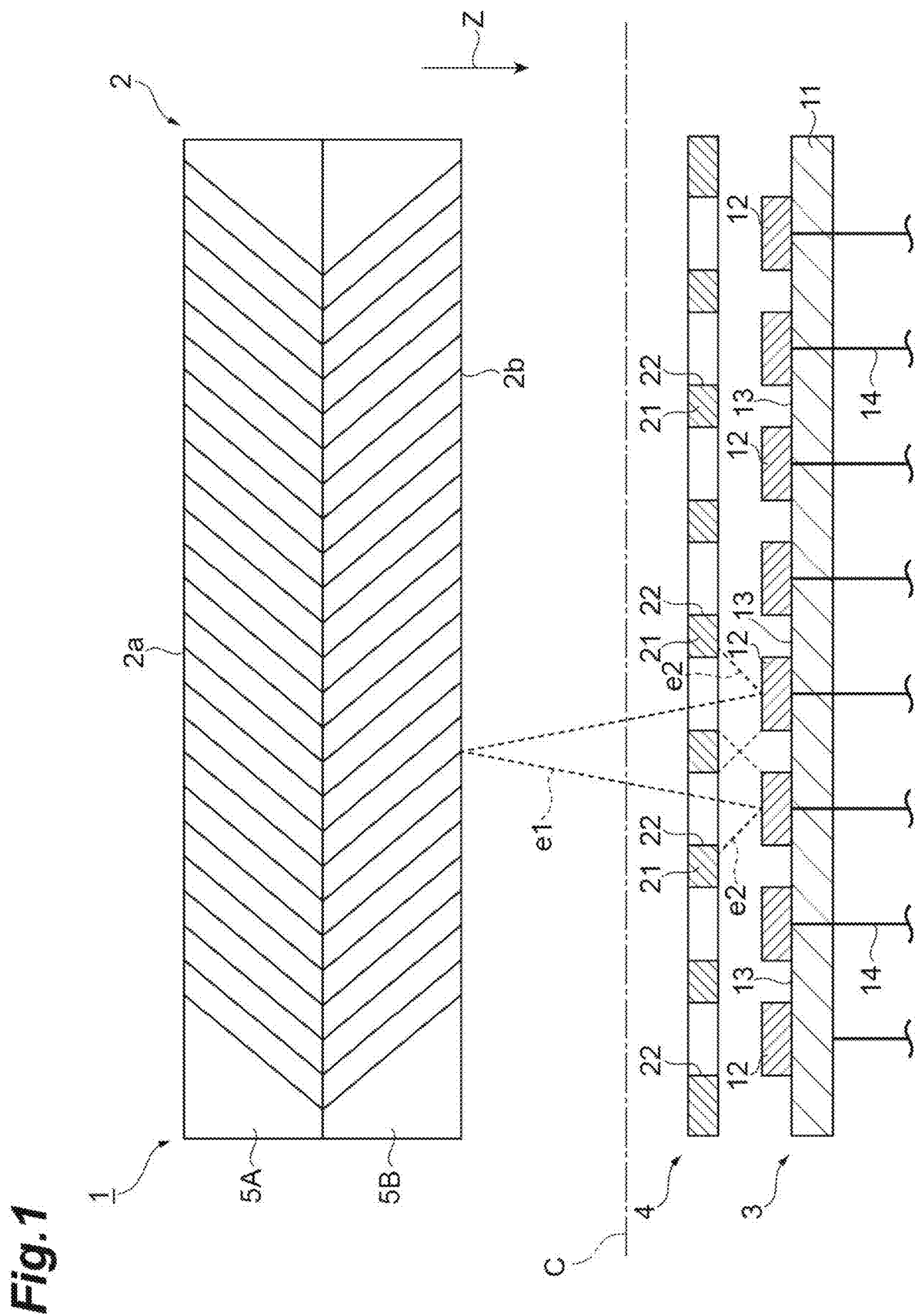
FIG. 1 is a schematic cross-sectional view illustrating a constitution example of a charged particle detector according to an embodiment of the present disclosure.

FIG. 1 is a schematic cross-sectional view illustrating a constitution example of the charged particle detector according to the embodiment of the present disclosure. Here, charged particles include electrons, ions, and the like. For example, a charged particle detector 1 illustrated in FIG. 1 is constituted as a multi-dynode-type electron detector used in X-ray photoelectron spectroscopy (XPS).

X-ray photoelectron spectroscopy is a technique for obtaining knowledge related to a kind, an abundance, a chemical bonding state, and the like of an element present on an top surface of a sample by measuring a kinetic energy of electrons (photoelectrons) emitted due to irradiation of the sample with monochromatic X-rays. Flying trajectories of photoelectrons are biased due to an electric field in a path leading to an electron detector, and photoelectrons are input to parts at different positions in the electron detector for each energy. In this case, since positional information related to electron detection and an energy of photoelectrons are associated with each other, the electron detector is required to have a high position detecting performance.

As illustrated in FIG. 1, the charged particle detector 1 is constituted to include a microchannel plate 2, a multi-dynode 3, and an anode 4. In the present embodiment, all the microchannel plate 2, the multi-dynode 3, and the anode 4 have a disk shape. The charged particle detector 1 is electrically connected to an external power supply and a bleeder circuit (not illustrated). A voltage is applied to the microchannel plate 2, the multi-dynode 3, and the anode 4 with a predetermined potential gradient by the bleeder circuit. An applied voltage is the highest in the anode 4, followed by the multi-dynode 3 and an output surface 2b of the microchannel plate 2 in that order.

The microchannel plate 2 has an input surface 2a having electrons (charged particles) input thereon, a pair of multiplication portions 5A and 5B performing multiplication of electrons (multiplication of secondary electrons) based on an input of electrons while maintaining positional information of electrons with respect to the input surface 2a, and the output surface 2b outputting electrons multiplied by the multiplication portions 5A and 5B. Each of the multiplication portions 5A and 5B is a secondary electron multiplication portion having a plurality of micro-channel structures independent from each other. In the multiplication portions 5A and 5B, the plurality of micro-channel structures are two-dimensionally arranged.

Each channel of the multiplication portions 5A and 5B has an inner diameter of approximately 10 μm and is inclined approximately 10° with respect to a normal direction (an input direction of electrons) of the input surface 2a. An inclination direction of respective channels is reversed between the multiplication portion 5A and the multiplication portion 5B. In the multiplication portions 5A and 5B, the input surface 2a side has a higher potential than the output surface 2b side. Electrons generated in response to arrival of electrons at the input surface 2a are multiplied by the multiplication portions 5A and 5B, and the multiplied electrons are output from the output surface 2b.

The multi-dynode 3 is an electrode multiplying electrons output from the microchannel plate 2. In each channel (each dynode 12) of the multi-dynode 3, a current is generated in accordance with the quantity of electrons multiplied during multiplication of electrons. The positional information related to electron detection can be acquired by drawing out this current value as a detection signal from each channel.

As illustrated in FIG. 1, the multi-dynode 3 is disposed parallel to the output surface 2b on the output surface 2b side of the microchannel plate 2. The multi-dynode 3 has an insulating substrate 11 and a plurality of dynodes 12 provided on the insulating substrate 11. For example, the insulating substrate 11 is constituted of a ceramic substrate, a glass epoxy substrate, or the like and has electrical insulation properties.

Figure 2:
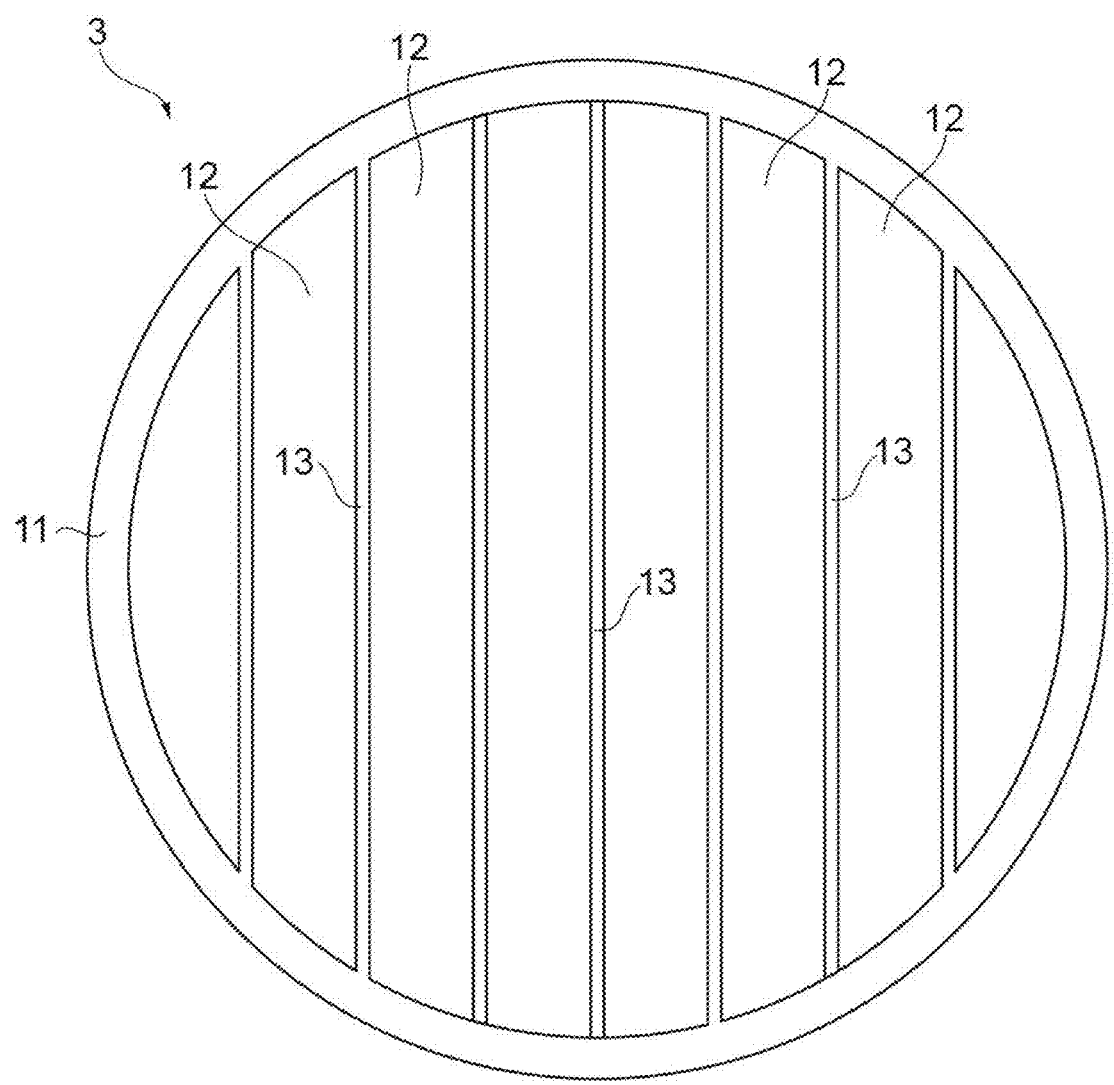
FIG. 2 is a plan view illustrating an example of a multi-dynode.

The dynodes 12 are parts for multiplying electrons output from the output surface 2b. In the present embodiment, as illustrated in FIG. 2, the dynodes 12 are disposed on the insulating substrate 11 with a striped split pattern. For example, the split pattern of the dynodes 12 can be formed by etching. In a plan view of the multi-dynode 3, each dynode 12 extends in one direction with a predetermined width. Each dynode 12 is electrically connected to the bleeder circuit described above and an output coupling circuit via a lead wire 14 (refer to FIG. 1).

Adjacent dynodes 12 and 12 are separated with a predetermined gap therebetween. Regions between adjacent dynodes 12 and 12 are dead spaces in which no dynode 12 is disposed, and they serve as insulation regions 13 in which the insulating substrate 11 is exposed. In the example of FIG. 2, the dynodes 12 are disposed on the insulating substrate 11 with a striped split pattern. For this reason, the disposition pattern of the insulation regions 13 is a striped pattern.

Figure 3:
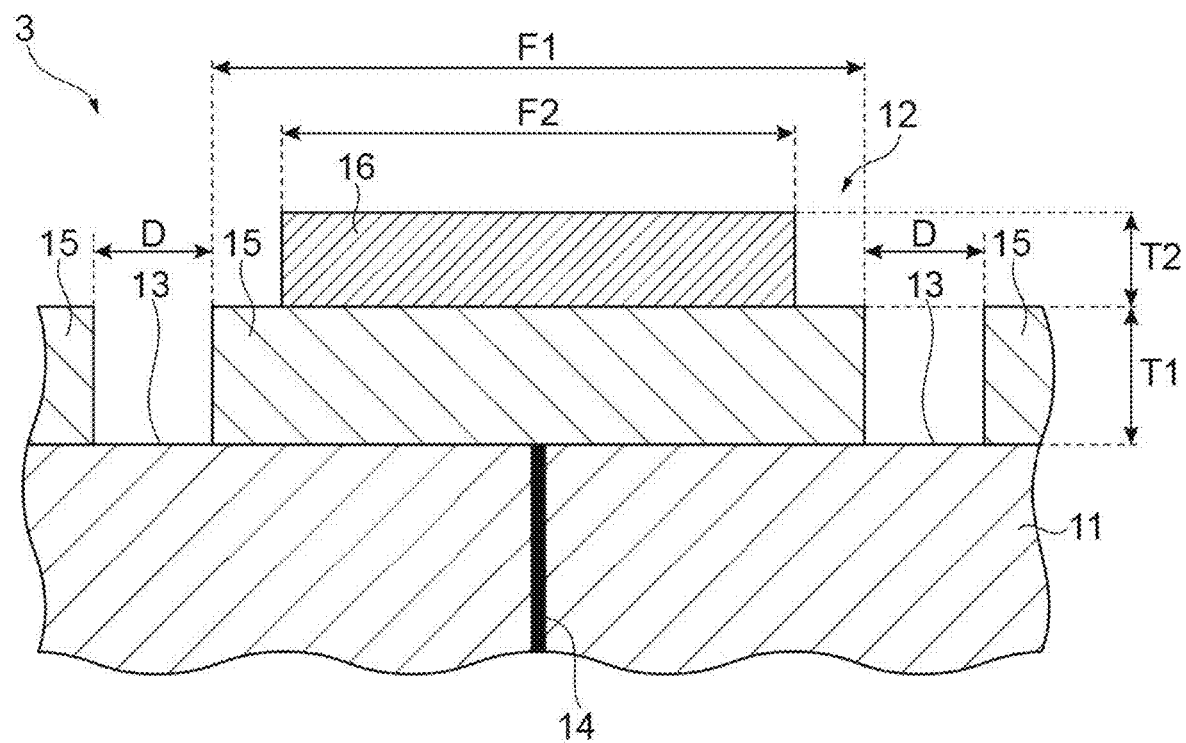
FIG. 3 is a schematic cross-sectional view illustrating a layer constitution of dynodes included in the multi-dynode.

As illustrated in FIG. 3, each of the dynodes 12 is constituted of an electrode layer 15 and a multiplication layer 16. For example, the electrode layer 15 is a copper foil electrode and is laminated on the insulating substrate 11. A surface of the electrode layer 15 may be subjected to gold flash processing. For example, the multiplication layer 16 is constituted of a material emitting secondary electrons such as MgO, MgF$_2$, or Al$_2$O$_3$ and is laminated on the electrode layer 15. Deficiency of electrons in the multiplication layer 16 due to emission of multiplied electrons is neutralized with supply of electrons from the electrode layer 15 that is a base layer.

A thickness T1 of the electrode layer 15 is larger than a thickness T2 of the multiplication layer 16. Both a width F1 of the electrode layer 15 and a width F2 of the multiplication layer 16 are sufficiently larger than widths D of the insulation regions 13 between the dynodes 12 and 12. In the present embodiment, the width F2 of the multiplication layer 16 is smaller than the width F1 of the electrode layer 15. Accordingly, when the dynodes 12 are viewed in a thickness direction, both edge portions of the electrode layer 15 in a width direction are in a state of being exposed from the multiplication layer 16.

Figure 4:
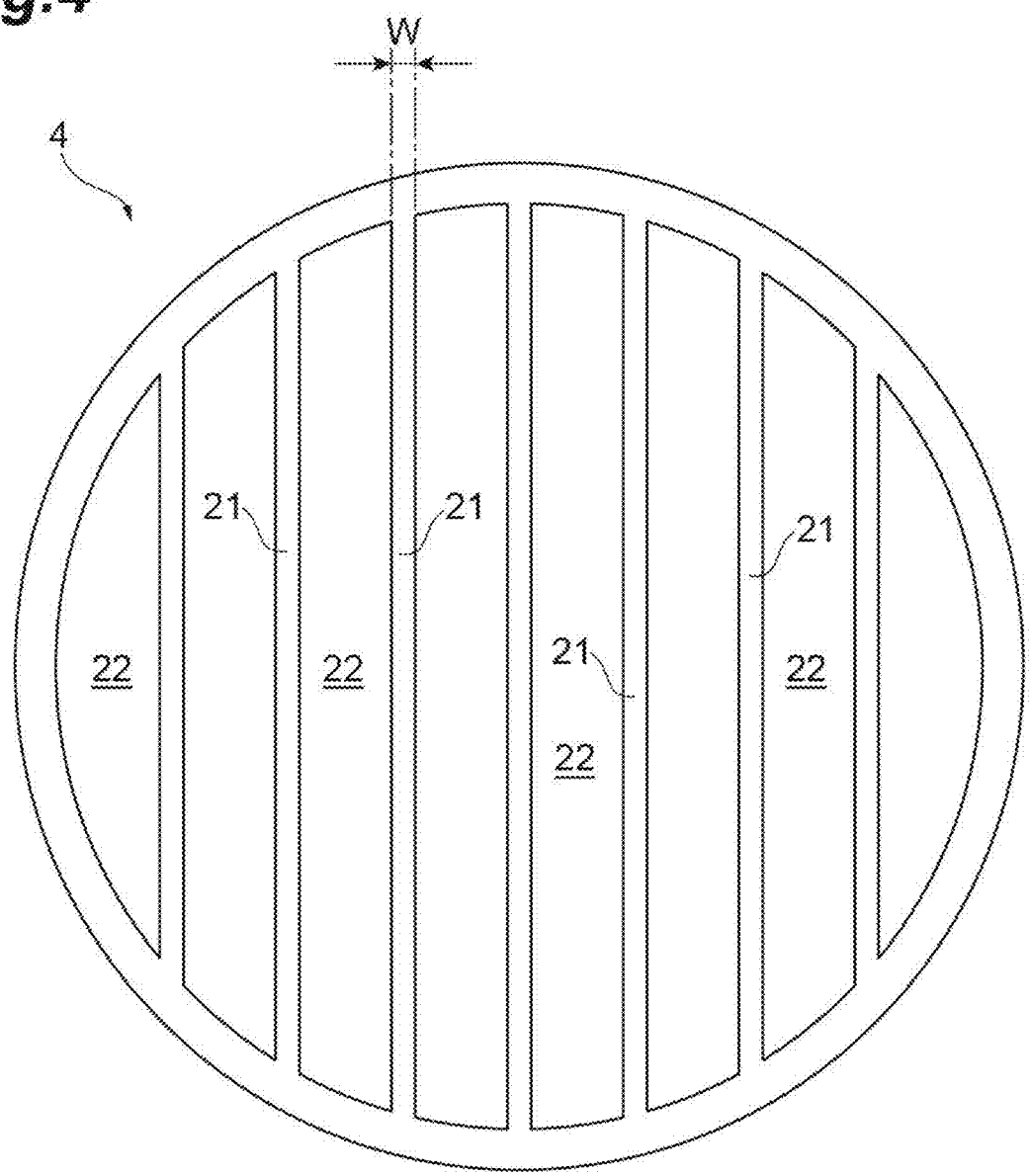
FIG. 4 is a plan view illustrating an example of an anode.

The anode 4 is an electrode having a role of collecting electrons amplified by each dynode 12 of the multi-dynode 3 and preventing reversion to the multi-dynode 3 side. The anode 4 is a so-called mesh-type anode. As illustrated in FIG. 4, the anode 4 has collection portions 21 for collecting electrons multiplied by the dynodes 12, and aperture portions 22 for allowing electrons output from the output surface 2b to pass therethrough to the dynodes 12 side. As illustrated in FIG. 1, the anode 4 is disposed in a spatial region between the output surface 2b and the multi-dynode 3. In the example of FIG. 1, the anode 4 is disposed parallel to the output surface 2b and the multi-dynode 3 at a position on the multi-dynode 3 side of an intermediate position C between the output surface 2b and the multi-dynode 3.

The collection portions 21 are disposed in a pattern corresponding to the split pattern of the dynodes 12 in the multi-dynode 3 (that is, the disposition pattern of the insulation regions 13). In the example of FIG. 4, the disposition pattern of the collection portions 21 is a striped pattern corresponding to the striped split pattern of the dynodes 12. Widths W of the collection portions 21 are equal to or larger than the widths D of the insulation regions 13 (refer to FIG. 3).

The anode 4 is disposed in the spatial region between the output surface 2b and the multi-dynode 3 such that centers of the collection portions 21 in the width direction and centers of the insulation regions 13 in the width direction coincide with each other. Accordingly, when viewed in an output direction Z of electrons e1 from the output surface 2b (refer to FIG. 1), all of the insulation regions 13 are in a state of overlapping the collection portions 21. Since all of the insulation regions 13 overlap the collection portions 21, incidence of the electrons e1 from the output surface 2b on the insulation regions 13 can be curbed.

When the anode 4 is not disposed in the spatial region between the output surface 2b and the multi-dynode 3, reversion of electrons emitted from secondary electron surfaces of the dynodes 12 (surface of the multiplication layer 16) to the multi-dynode 3 side may occur. In this case, electrons which have reverted to the multi-dynode 3 side are incident on the secondary electron surfaces again and are absorbed. Since electrons absorbed by the secondary electron surfaces are not drawn out as a detection signal from the dynodes 12, it is conceivable that original electron multiplication ability of the material emitting secondary electrons is not exhibited in the dynodes 12 and it becomes difficult to improve a dynamic range of the charged particle detector 1.

In contrast, in the charged particle detector 1, the anode 4 is disposed in the spatial region between the output surface 2b and the multi-dynode 3. When the anode 4 is disposed, as illustrated in FIG. 1, electrons e2 emitted from the secondary electron surfaces of the dynodes 12 are collected by the collection portions 21, and reversion to the multi-dynode 3 side can be curbed. Therefore, practical electron multiplication factors of the dynodes 12 can be increased, and the dynamic range of the charged particle detector 1 can be improved.

Detection signals output from the anode 4 are theoretically equivalent to the sum of detection signals from the respective dynodes 12 of the multi-dynode 3 (however, the polarities of detection signals from the anode 4 are reversed with respect to the polarities of detection signals from the respective dynodes 12). Therefore, detection signals output from the anode 4 can be used in the respective dynodes 12 for detecting a counting error (miss count) of electrons. Measurement accuracy in X-ray photoelectron spectroscopy can be insured by detecting a counting error.

The widths W of the collection portions 21 may be adjusted with a distance between the anode 4 and the multi-dynode 3 in the output direction Z of the electrons e1. The electrons e1 output from the output surface 2b of the microchannel plate 2 travel to the multi-dynode 3 side at a certain spread angle. For this reason, when the position of the anode 4 is closer to the microchannel plate 2, the widths W of the collection portions 21 in the anode 4 may be further reduced.

However, when the anode 4 is excessively close to the microchannel plate 2, there is concern that the electrons e1 from the output surface 2b may be directly collected by the anode 4 and may not arrive at the multi-dynode 3. In the present embodiment, in consideration of this matter, the anode 4 is disposed on the multi-dynode 3 side of the intermediate position C between the output surface 2b and the multi-dynode 3. Therefore, it is preferable that the widths W of the collection portions 21 be larger than the widths D of the insulation regions 13.

Figure 5:
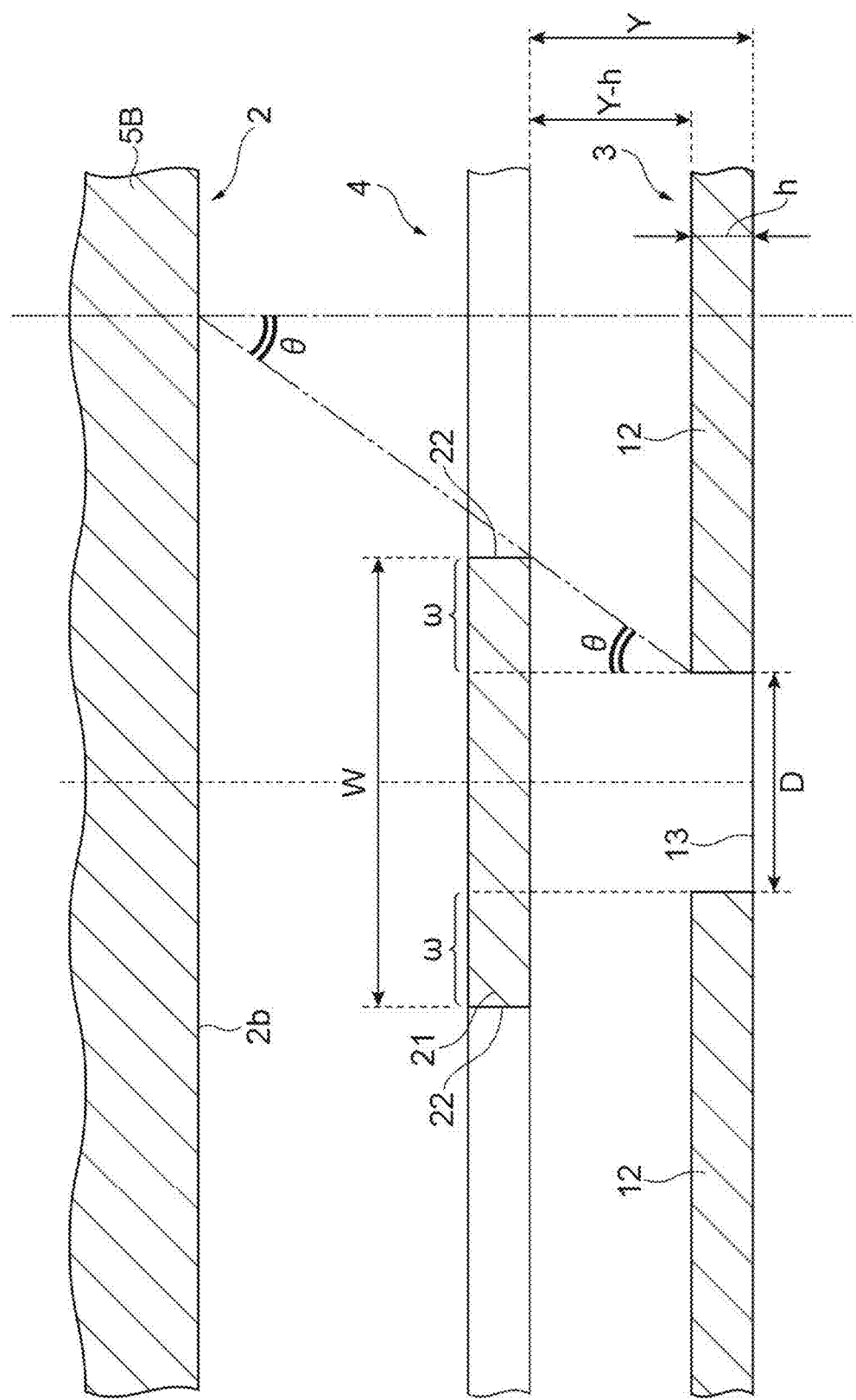
FIG. 5 is a schematic cross-sectional view illustrating a disposition relationship between insulation regions in the multi-dynode and collection portions in the anode.

Regarding a disposition relationship between the insulation regions 13 and the collection portions 21, in the charged particle detector 1, as illustrated in FIG. 5, when the spread angle of the electrons e1 output from the output surface 2b is θ, heights of the dynodes 12 (the total of the thickness T1 of the electrode layer 15 and the thickness T2 of the multiplication layer) are h, widths of the insulation regions 13 are D, and a distance from (a bottom surface of) the anode 4 to the bottom surfaces of the dynodes 12 is Y, the widths W of the collection portions 21 satisfy W=2(Y−h)tan θ+D.

In FIG. 5, in the collection portions 21, when viewed in the output direction Z of electrons from the output surface 2b, if widths of parts overlapping the dynodes 12 are w, the widths @ are obtained by ω=(Y−h)tan θ. Since the widths W of the collection portions 21 are obtained by W=2ω+D, the foregoing expression can be derived. Incidence of electrons on the insulation regions 13 can be more reliably curbed with respect to the spread angle θ of electrons output from the output surface 2b by satisfying such a disposition relationship.

The aperture portions 22 are parts for allowing electrons output from the output surface 2b to pass therethrough to the multi-dynode 3 side. As illustrated in FIG. 4, the disposition pattern of the aperture portions 22 is a striped pattern corresponding to the disposition pattern of the dynodes 12. For example, an aperture ratio of the anode 4 by the aperture portions 22 is suitably set in accordance with the widths of the dynodes 12 (here, the width F1 of the electrode layer 15). For example, the aperture ratio of the anode 4 is set to increase as the widths of the dynodes 12 increase. When the widths of the dynodes 12 are 1.0 mm, the aperture ratio of the anode 4 is set to approximately 80%, for example. When the widths of the dynodes 12 are 2.0 mm, the aperture ratio of the anode 4 is set to approximately 90%, for example.

As described above, in the charged particle detector 1, when viewed in the output direction Z of electrons output from the output surface 2b of the microchannel plate 2, all of the insulation regions 13 in the multi-dynode 3 overlap the collection portions 21 in the anode 4. For this reason, incidence of electrons from the output surface 2b on the insulation regions 13 can be curbed, and electrification can be prevented from occurring in the insulation regions 13. Accordingly, occurrence of crosstalk due to capacitive coupling between the dynodes 12 and 12 can be curbed. In addition, since electrification in the insulation regions 13 is prevented, in addition to curbing occurrence of crosstalk between the dynodes 12 and 12, an effect of preventing change in trajectory of incident electrons and an effect of preventing generation of a false signal due to electric discharge are also exhibited. Therefore, in the charged particle detector 1, a detection signal from the multi-dynode 3 can be stably acquired. When the charged particle detector 1 is applied to an electron detector in X-ray photoelectron spectroscopy, the electron detector can exhibit a high position detecting performance.

In the charged particle detector 1, the anode 4 is disposed on the multi-dynode 3 side of the intermediate position C between the output surface 2b and the multi-dynode 3. Accordingly, electrons multiplied by each dynode 12 of the multi-dynode 3 can be efficiently collected by the anode 4. Therefore, the practical electron multiplication factor can be increased, and the dynamic range of the charged particle detector 1 can be improved.

In the charged particle detector 1, each of the dynodes 12 is constituted of the insulating substrate 11 and the electrode layer 15 and the multiplication layer 16 provided on the insulating substrate 11. In addition, the width F2 of the multiplication layer 16 is smaller than the width F1 of the electrode layer 15. According to such a constitution, since the multiplication layer 16 is distant from the insulating substrate 11, capacitive coupling between the dynodes 12 and 12 can be prevented. Therefore, occurrence of crosstalk between the dynodes 12 and 12 can be more reliably curbed.

In the charged particle detector 1, when the spread angle of electrons output from the output surface 2b is θ, the heights of the dynodes 12 are h, the widths of the insulation regions 13 are D, and the distance from the anode 4 to the bottom surfaces of the dynodes 12 is Y, the widths W of the collection portions 21 satisfy $W=2(Y-h)\tan\theta+D$. It is possible to more reliably curb incidence of electrons output from the output surface 2b on the insulation regions 13 at the spread angle θ by satisfying such conditions.

The present disclosure is not limited to the foregoing embodiment. For example, in the foregoing embodiment, the anode 4 and the multi-dynode 3 are subjected to positioning such that the centers of the collection portions 21 in the width direction and the centers of the insulation regions 13 in the width direction coincide with each other. However, when viewed in the output direction of electrons from the output surface 2b, as long as all of the insulation regions 13 are in a state of overlapping the collection portions 21, the centers of the collection portions 21 in the width direction and the centers of the insulation regions 13 in the width direction may not necessarily coincide with each other.

In the foregoing embodiment, the heights of the respective dynodes 12 in the multi-dynode 3 are uniform (refer to FIG. 1). However, the height may vary for each of the dynodes 12. For example, in X-ray photoelectron spectroscopy, flying trajectories of photoelectrons are controlled such that a position where electrons are detected by the electron detector varies for each energy. Since a secondary electron emission rate of the material emitting secondary electrons varies in accordance with the energy of primary electrons, in the charged particle detector 1 (electron detector), an in-plane distribution of gains corresponding to the energy of electrons input to the input surface 2a may be generated in the microchannel plate 2.

On the other hand, as in electrons flying from the output surface 2b of the microchannel plate 2 to the multi-dynode 3, when the energy of primary electrons incident on the material emitting secondary electrons is the same, since the characteristics of the material emitting secondary electrons contributing to the gains are unique to the material, an apparent secondary electron emission rate varies in accordance with the thickness of the material emitting secondary electrons. Therefore, the in-plane distribution of gains in the microchannel plate 2 can be corrected on the multi-dynode 3 side by varying the height (thickness) for each of the dynodes 12.

Figure 6A:
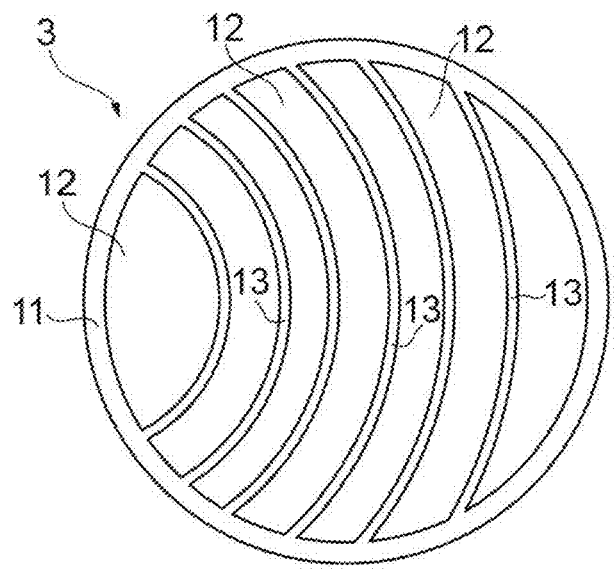
FIG. 6A is a plan view illustrating a modification example of the multi-dynode.

In the foregoing embodiment, the dynodes 12 are disposed on the insulating substrate 11 with a striped split pattern. However, various modifications can be applied to the split pattern of the dynodes 12. For example, as illustrated in FIG. 6A, the split pattern of the dynodes 12 may be an arc-shaped pattern having a starting point outside the multi-dynode 3. In X-ray photoelectron spectroscopy, an energy distribution when photoelectrons arrive at the charged particle detector 1 serving as an electron detector becomes an arc-shaped distribution having a starting point outside as in FIG. 6A. Therefore, the positional information related to electron detection can be accurately acquired by causing the split pattern of the dynodes 12 to coincide with the energy distribution of photoelectrons.

Figure 6B:
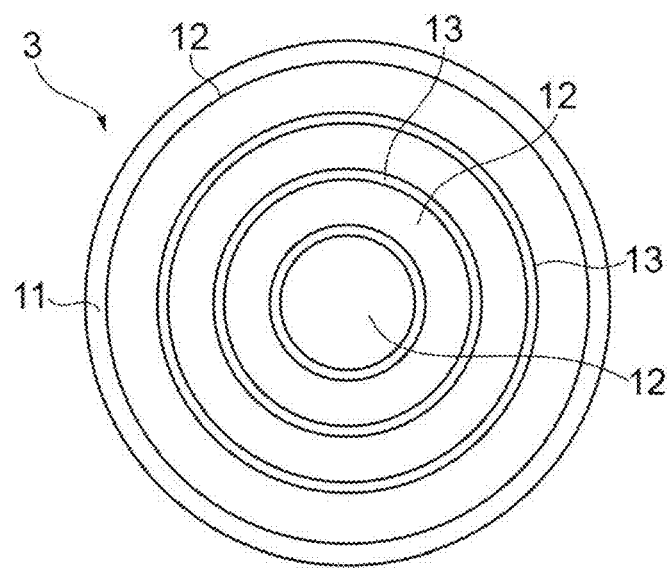
FIG. 6B is a plan view illustrating another modification example of the multi-dynode.
Figure 6C:
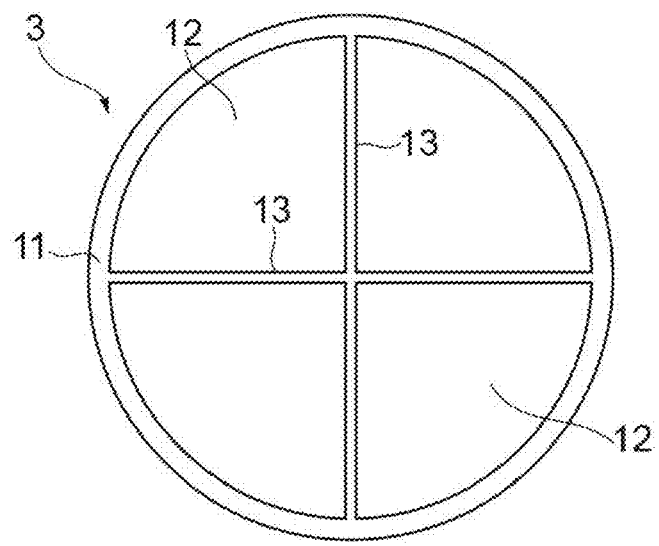
FIG. 6C is a plan view illustrating another modification example of the multi-dynode.

As illustrated in FIG. 6B, the split pattern of the dynodes 12 may be a concentric circular-shaped pattern having the center of the multi-dynode 3 as a starting point, and as illustrated in FIG. 6C, it may be a fan-shaped pattern split around the center of the multi-dynode 3 (here, split into four).

Figure 7A:
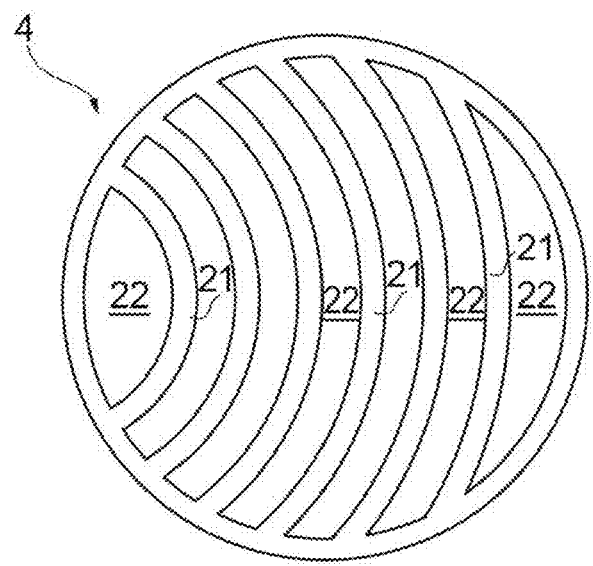
FIG. 7A is a plan view illustrating a modification example of the anode.
Figure 7B:
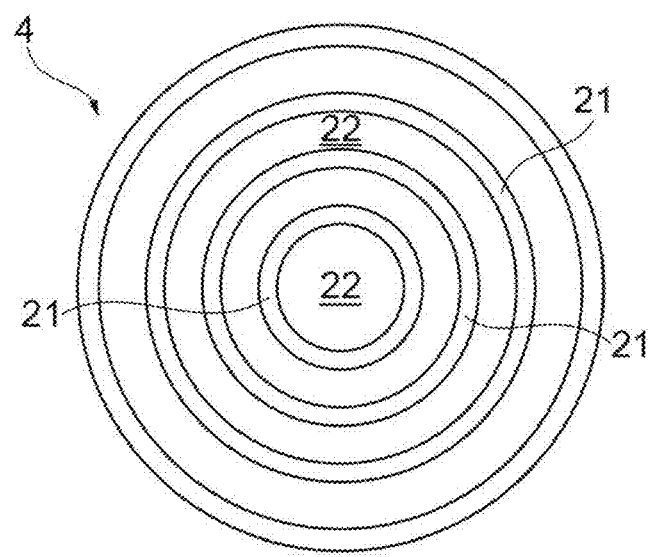
FIG. 7B is a plan view illustrating another modification example of the anode.
Figure 7C:
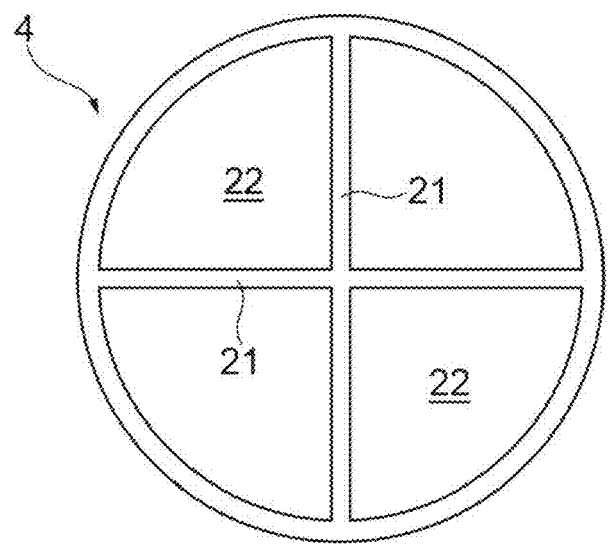
FIG. 7C is a plan view illustrating another modification example of the anode.

The disposition pattern of the collection portions 21 in the anode 4 may also be modified in accordance with the modifications in FIGS. 6A to 6C. Regarding the split pattern of the dynodes 12 illustrated in FIG. 6A, the disposition pattern of the collection portions 21 corresponds to the insulation regions 13 in FIG. 6A, and an arc-shaped pattern having a starting point outside the multi-dynode 3 may be employed as illustrated in FIG. 7A. Regarding the split pattern of the dynodes 12 illustrated in FIG. 6B, the disposition pattern of the collection portions 21 corresponds to the insulation regions 13 in FIG. 6B, and a concentric circular-shaped pattern having the center of the multi-dynode 3 as a starting point may be employed as illustrated in FIG. 7B. Regarding the split pattern of the dynodes 12 illustrated in FIG. 6C, the disposition pattern of the collection portions 21 corresponds to the insulation regions 13 in FIG. 6C, and a cross-shaped pattern passing through the center of the multi-dynode 3 may be employed as illustrated in FIG. 7C.

Figure 8:
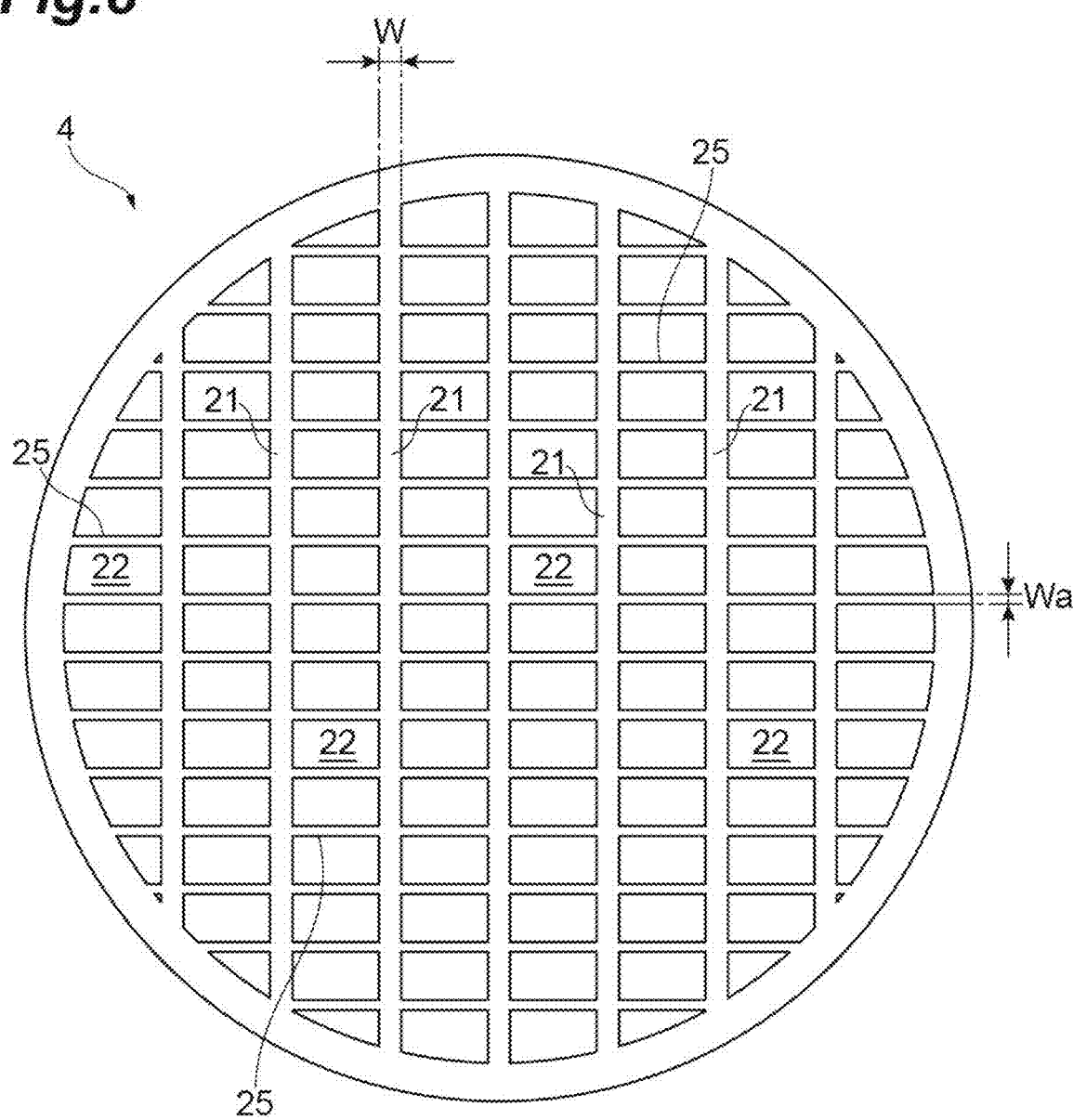
FIG. 8 is a plan view illustrating an example of the anode having auxiliary collection portions.

The anode 4 may further have auxiliary collection portions 25 laid across the aperture portions 22. For example, the auxiliary collection portions 25 can be integrally formed with the collection portions 21 by etching. FIG. 8 illustrates an example of the anode 4 in which the auxiliary collection portions 25 are applied to the collection portions 21 having a striped pattern illustrated in FIG. 4. In the example of FIG. 8, the auxiliary collection portions 25 are disposed at equal intervals in a direction orthogonal to the collection portions 21 disposed in a stripe shape. When the auxiliary collection portions 25 are provided in the anode 4, electrons multiplied by each dynode 12 of the multi-dynode 3 can be more efficiently collected by the anode 4.

When the auxiliary collection portions 25 are provided in the anode 4, widths Wa of the auxiliary collection portions 25 may be smaller than the widths W of the collection portions 21. By means of this, while permeability of electrons from the anode 4 to the multi-dynode 3 is maintained, electrons multiplied by each dynode 12 of the multi-dynode 3 can be efficiently collected by the anode 4.

Figure 9:
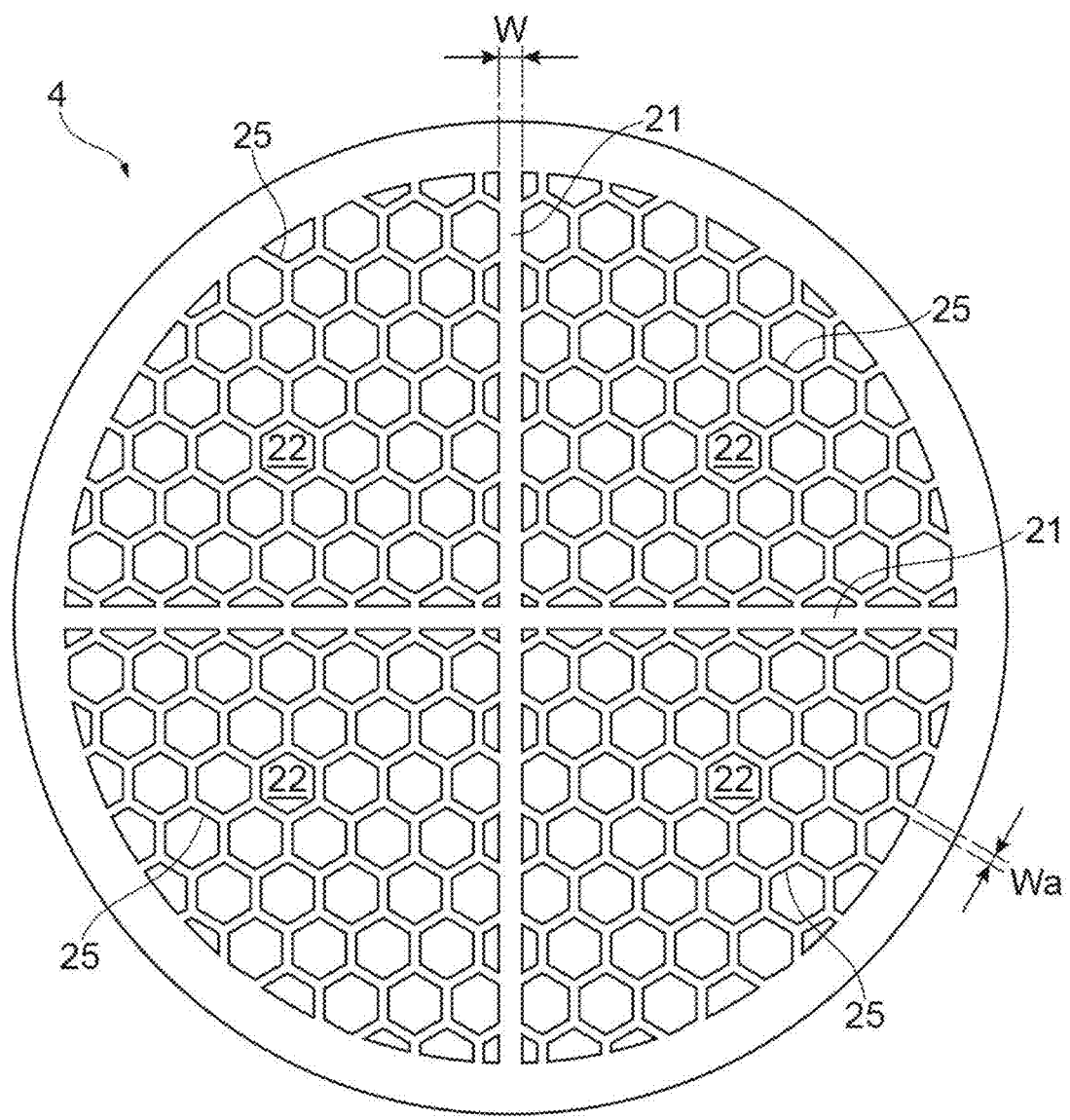
FIG. 9 is a plan view illustrating another example of the anode having auxiliary collection portions.

The shape (planar shape) of the auxiliary collection portions 25 is not limited to a linear shape or a curved shape. For example, a honeycomb shape may be employed as illustrated in FIG. 9. FIG. 9 illustrates an example of the anode 4 in which the auxiliary collection portions 25 having a honeycomb shape are applied to the collection portions 21 having a cross-shaped pattern illustrated in FIG. 7C. Even in such a shape, similar to the case of FIG. 8, while permeability of electrons from the anode 4 to the multi-dynode 3 is maintained, electrons multiplied by each dynode 12 of the multi-dynode 3 can be efficiently collected by the anode 4. In addition, due to the honeycomb shape of the auxiliary collection portions 25, even when the widths Wa of the auxiliary collection portions 25 are made narrower than the widths W of the collection portions 21, strength of the auxiliary collection portions 25 can be sufficiently secured.

Figure 10:
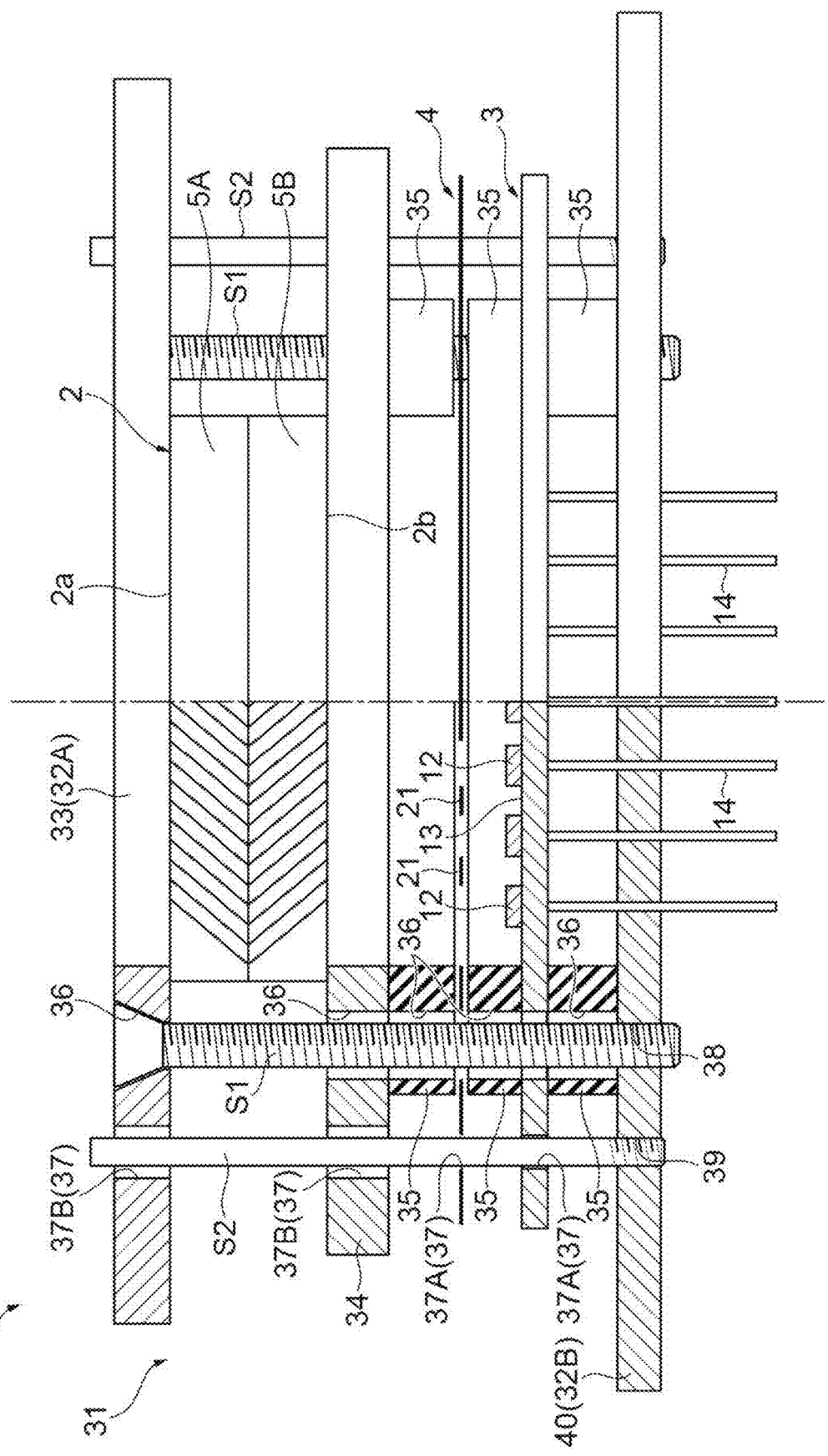
FIG. 10 is a schematic partial cross-sectional view illustrating a constitution example of the charged particle detector including a positioning mechanism for the anode and the multi-dynode.

The charged particle detector 1 may have a positioning mechanism 31 for performing positioning of the anode 4 and the multi-dynode 3. FIG. 10 is a schematic partial cross-sectional view illustrating a constitution example of the charged particle detector including a positioning mechanism for the anode and the multi-dynode. As illustrated in FIG. 10, the positioning mechanism 31 is constituted to include a first end portion electrode 32A on the microchannel plate 2 side and a second end portion electrode 32B on the multi-dynode 3 side. Further, the anode 4 and the multi-dynode 3 is screw-fixed in a state of being sandwiched between the first end portion electrode 32A and the second end portion electrode 32B.

More specifically, in the example of FIG. 10, an IN-side electrode 33 and an OUT-side electrode 34 (microchannel plates), a plurality of insulating spacers 35, and a substrate electrode 40 are used for assembling the microchannel plate 2, the multi-dynode 3, and the anode 4. The IN-side electrode 33 and the OUT-side electrode 34 have annular shapes and are disposed such that the microchannel plate 2 is sandwiched therebetween.

The insulating spacers 35 have annular shapes and are disposed between the OUT-side electrode 34 and the anode 4, between the anode 4 and the multi-dynode 3, and between the multi-dynode 3 and the substrate electrode 40, respectively. The substrate electrode 40 has a disk shape and is disposed between the multi-dynode 3 and the substrate electrode 40 on the outward side of the insulating spacers 35. The IN-side electrode 33 corresponds to the first end portion electrode 32A, and the substrate electrode 40 corresponds to the second end portion electrode 32B.

An insertion hole 36 through which a fixing screw S1 can be inserted and an insertion hole 37 through which a positioning screw S2 can be inserted are provided in respective edge portions of each of the IN-side electrode 33, the OUT-side electrode 34, the insulating spacers 35, the multi-dynode 3, and the anode 4. A screw hole 38 for screwing the fixing screw S1 and a screw hole 39 for screwing the positioning screw S2 are provided in respective edge portions of the substrate electrode 40. When these members are assembled, first, the positioning screw S2 is screwed into the screw hole 39 of the substrate electrode 40. The IN-side electrode 33, the OUT-side electrode 34, the anode 4, and the multi-dynode 3 are layered on the substrate electrode 40 by inserting the positioning screw S2 into the insertion hole 37 while having the positioning screw S2 as a strut.

A hole diameter of the insertion hole 37 (insertion hole 37A) in the multi-dynode 3 and the anode 4 is smaller than a hole diameter of the insertion hole 37 (insertion hole 37B) in the IN-side electrode 33 and the OUT-side electrode 34. Therefore, the IN-side electrode 33 and the OUT-side electrode 34 are subjected to positioning by the positioning screw S2. In contrast, the anode 4 and the multi-dynode 3 are accurately subjected to positioning by the positioning screw S2.

Next, the microchannel plate 2 is disposed between the IN-side electrode 33 and the OUT-side electrode 34. In addition, the insulating spacers 35 are disposed between the OUT-side electrode 34 and the anode 4, between the anode 4 and the multi-dynode 3, and between the multi-dynode 3 and the substrate electrode 40, respectively. Thereafter, the fixing screw S1 is inserted through the insertion hole 36 of each member from the IN-side electrode 33, and a tip of the fixing screw S1 is screwed into the screw hole 38 of the substrate electrode 40. Accordingly, assembling of the members is completed in a state in which the multi-dynode 3 and the anode 4 are accurately subjected to positioning. After assembling, the positioning screw S2 may be removed.

According to the positioning mechanism 31 described above, positioning of the anode 4 and the multi-dynode 3 can be simply performed. As a result, the insulation regions 13 in the multi-dynode 3 and the collection portions 21 in the anode 4 can have an accurately coincident disposition relationship therebetween as designed.

In the foregoing embodiment, an electron detector has been exemplified as the charged particle detector 1. However, the charged particle detector of the present disclosure can also be applied to other applications, such as an ion detector, for example. When the charged particle detector is used as an ion detector, ions (charged particles) are input to the detector. Input ions are converted into secondary electrons in a microchannel plate, and substances to be output as a result thereof are electrons.

What is claimed is:

1. A charged particle detector comprising:
a microchannel plate having an input surface having charged particles input thereon, a multiplication portion performing multiplication of electrons based on an input of the charged particles while maintaining positional information of the charged particles with respect to the input surface, and an output surface outputting electrons multiplied by the multiplication portion;
a multi-dynode having a plurality of dynodes multiplying the electrons output from the output surface, and insulation regions positioned between the dynodes; and
an anode disposed in a spatial region between the output surface and the multi-dynode, and having collection portions for collecting electrons multiplied by the dynodes and aperture portions for allowing electrons output from the output surface to pass therethrough to the multi-dynode side,
wherein all of the insulation regions overlap the collection portions when viewed in an output direction of the electrons from the output surface.

2. The charged particle detector according to claim 1, wherein the anode is disposed on the multi-dynode side of an intermediate position between the output surface and the multi-dynode.

3. The charged particle detector according to claim 1, wherein the anode further has auxiliary collection portions laid across the aperture portions.

4. The charged particle detector according to claim 3, wherein widths of the auxiliary collection portions are smaller than widths of the collection portions.

5. The charged particle detector according to claim 1, wherein the dynodes are constituted of an insulating substrate, and an electrode layer and a multiplication layer provided on the insulating substrate, and
wherein a width of the multiplication layer is smaller than a width of the electrode layer.

6. The charged particle detector according to claim 1, wherein when a spread angle of electrons output from the output surface is $\theta$, heights of the dynodes are h, widths of the insulation regions are D, and a distance from the anode to bottom surfaces of the dynodes is Y, widths W of the collection portions satisfy $W=2(Y-h)\tan\theta+D$.

7. The charged particle detector according to claim 1 further comprising:
a positioning mechanism performing positioning of the anode and the multi-dynode,
wherein the positioning mechanism includes a first end portion electrode on the microchannel plate side and a second end portion electrode on the multi-dynode side, and
wherein the anode and the multi-dynode are screw-fixed in a state of being sandwiched between the first end portion electrode and the second end portion electrode.

* * * * *